United States Patent [19]

Arnold

[11] 3,780,795

[45] Dec. 25, 1973

[54] MULTILAYER HEAT SINK

[75] Inventor: Anthony Francis Arnold, Ringoes, N.J.

[73] Assignee: RCA Corporation, Princeton, N.J.

[22] Filed: June 19, 1972

[21] Appl. No.: 263,992

[52] U.S. Cl. .................................. 165/80, 165/185

[51] Int. Cl. ................................................ F28f 7/00

[58] Field of Search ......................... 165/47, 80, 185

[56] References Cited

UNITED STATES PATENTS

| | | | |
|---|---|---|---|
| 3,249,680 | 5/1966 | Sheets et al. | 165/80 |
| 3,476,177 | 11/1969 | Potzl | 165/80 |

*Primary Examiner*—Charles Sukalo
*Attorney*—Glenn H. Bruestle et al.

[57] ABSTRACT

An improved heat sink comprises an integral metallic structure, having upper and lower layers of different metals, respectively, fixed to each other to provide a common interface. The lower layer has a greater coefficient of thermal expansion than the upper layer. An upwardly extending dimpled portion of the upper layer is formed by a dent that extends upwardly from the common interface. When the heat sink is heated by a heat-producing device mounted on the surface of the dimpled portion, the lower layer tends to expand in an opposite direction to that of the dimpled portion of the upper layer, so that the dimpled portion is in compression, thereby limiting the amount of thermal expansion and distortion that would normally occur at the surface of the dimpled portion.

18 Claims, 3 Drawing Figures

MULTILAYER HEAT SINK

BACKGROUND OF THE INVENTION

This invention relates generally to heat sinks, and more particularly, to a multilayer heat sink with limited thermal expansion at the site for receiving a heat-producing device thereon. The novel multilayer heat sink is particularly useful for preventing the cracking and/or breaking away of a heat-producing device mounted on the heat sink.

Because of the differences in the coefficients of linear thermal expansion between certain mounting substrates of electronic components and the metallic heat sinks upon which they are mounted, the substrates may crack and/or become loosened and break away from the heat sinks with use. It has been proposed to match the coefficients of linear thermal expansion of the substrates with the metals of the heat sinks, but in many cases the metals with the matching coefficients either do not possess the desired thermal conductivities or are too expensive, and, therefore, are unsuitable.

SUMMARY OF THE INVENTION

A novel heat sink comprises a multilayered structure of different materials which, when heated, tend to expand differently and to produce compressive forces resulting in a lesser expansion on a portion of one surface of the heat sink than on other surface portions of the heat sink. A heat-producing device is mounted on the portion of lesser expansion. In a preferred embodiment, the multilayered structure comprises first and second layers of first and second metals, respectively, having a common interface and different coefficients of linear expansion. A raised, or dimpled, portion of the first layer, having the lower coefficient of expansion, extends from the common interface. The heat-producing device is mounted on a surface of the raised portion.

DESCRIPTION OF THE PREFERRED EMBODIMENTS

Figure 1:
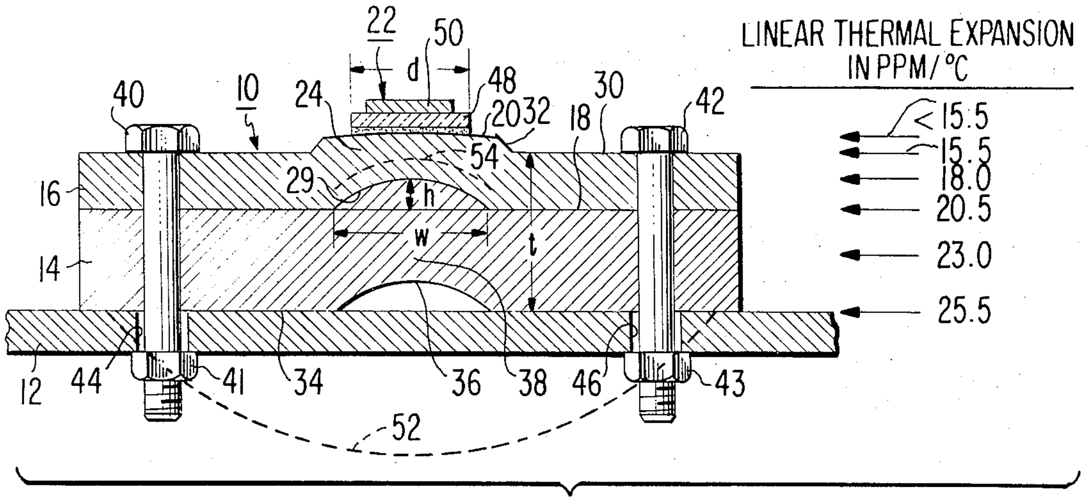
FIG. 1 is a cross-sectional view, in side elevation, of one embodiment of the novel multilayer heat sink taken along the line 1—1 in FIG. 2, and viewed in the direction of the arrows.
Figure 2:
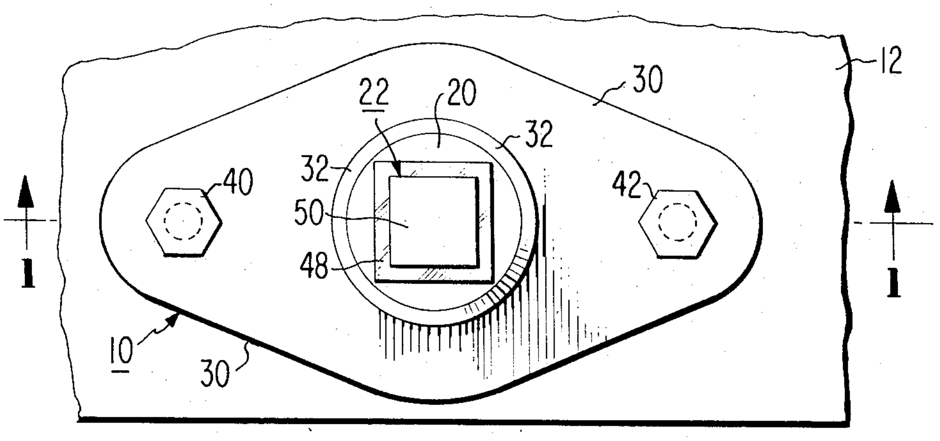
FIG. 2 is a plan view of the novel multilayer heat sink.

Referring now to FIGS. 1 and 2 of the drawing, there is shown a preferred embodiment of the multilayer heat sink 10 mounted on a metal sheet 12, such as of a chassis (not shown) for electronic equipment. The multilayer heat sink 10 is an integral metallic structure, somewhat rhombic in shape, and comprising at least two layers of different metals, respectively. Thus, for example, the heat sink 10 comprises a lower layer 14 of aluminum, magnesium, or zinc, for example, and an upper layer 16 of a metal such as copper, silver, or gold, for example. The lower surface of the upper layer 16 is fixed to the upper surface of the lower layer 14 by any suitable means to form a bonded common interface 18 therewith. The layer 16 may be fixed to the layer 14, for example, by welding the two layers together, or by soldering the layers together, or by plating one layer onto the other, or by melting one layer onto the other, or by sintering one metal onto the other. Preferably, the layers 14 and 16 should be in contact with each other at all points of the common interface 18. The metal of the lower layer 14 should have a greater coefficient of thermal expansion than the metal of the upper layer 16 for the proper operation of the novel heat sink 10.

Means are provided in the heat sink 10 to limit the amount of linear thermal expansion of the heat sink 10, especially at a surface site 20 upon which a heat-producing device 22 is mounted. To this end, a raised, or dimpled portion 24 of the layer 16 is formed in the center of the heat sink 10 by a dent 29 extending upwardly from the common interface 18. The upper surface of the dimpled portion 24 comprises the site 20 upon which the heat-producing device 22 is mounted, and the dimpled portion 24 protrudes outwardly from the plane of an upper surface 30 of the layer 16, forming a round, raised pedestal 32.

The dimpled portion 24 can be produced by placing a bimetallic strip of the layers 14 and 16 in a mold so that the surface 30 is disposed over a depression in the shape of the pedestal 32. A lower surface 34 of the lower layer 14 can then be dented with a rounded punch to produce a dent 36 in the surface 34, and, consequently, to produce a dimpled portion 38 in the lower layer 14, the dent 29 in the interface 18, and the dimpled portion 24 in the upper layer 16. Thus, the dimpled portion 24 of the layer 16 may be said to extend from dent 29 in the common junction 18 to form the pedestal 32 upon which the heat-producing device 22 is mounted.

The multilayer heat sink 10 may be mounted on the sheet 12 by screws 40 and 42 and nuts 41 and 43, respectively. The screws 40 and 42 pass through holes in the heat sink 10 and oversized holes 44 and 46 in the sheet 12. The holes 44 and 46 are oversized to provide for expansion of the heat sink 10 during use.

In one embodiment of the multilayer heat sink 10 the lower layer 14 is of aluminum having a thickness of 0.073 inch. The upper layer 16 is of copper having a thickness of 0.040 inch, making an overall thickness *t* of 0.113 (in the non-dimpled portions). The depth of the dent 29 in the dimpled portion 24 of the layer 16, extending from the plane formed by the major portion of the common interface 18, and designated by the letter *h*, may be between 1 percent and 70 percent of the thickness *t*, and preferably between 15 percent and 35 percent of the thickness *t*. The width *w*, that is, the average diameter of the base of the dent 29 may be between 20 percent and 300 percent of the width d of the mounting substrate 48 of the heat-producing device 22, and preferably between 50 percent and 150 percent of the width *d*. The exact shapes of the heat sink 10 and the pedestal 32 are not critical.

The ratio of the strengths of the layers 14 and 16, (each strength being measured as the product of the thickness of the layer, on the non-dimpled portion, and its modulus of elasticity) should be within ± 60 percent of each other, and preferably within ±20 percent of each other. Ideally, the ratio of the strengths of the layers 14 and 16 should be 1:1.

The heat-producing device 22 comprises the substrate 48, such as of a ceramic material like alumina or silicon, provided with circuit elements 50, illustrated herein in block diagram form. The substrate 48 has a mounting surface that is metallized and soldered to the surface site 20 of the dimpled portion 24 of the layer 16.

The surface site 20 may be planar but it is preferable for it to be slightly convex so that the substrate 48 can be soldered to the surface site 20 by first placing a solder preform between the metallized surface of the substrate 48 and the surface 20 and then applying heat to the surface site 20 until the preform melts. If the contour of the surface 20 is slightly convex, rather than planar, the molten solder flows more evenly from the center of the substrate 48 toward its perimeter.

Looking at FIG. 1, there are indicated the linear thermal expansions, in parts per million per °C (ppm/°C), of the different levels of the multilayer heat sink 10. Assuming that the layers 14 and 16 are aluminum and copper, respectively, their linear thermal expansions in ppm/°C are 23 and 18, respectively. The linear thermal expansion in ppm/°C at the common interface 18 is the average (20.5) of the thermal expansions of both the layers 14 and 16. Thus, at the level of the surface site 20, the thermal expansion is less than 15.5. On the planar surface 30, it is 15.5. In the center of the metal of the layer 16, it is 23; and, at the bottom surface 34, it is 25.5

If the modulus of elasticity is taken as $10 \times 10^6$ lbs/in$^2$ for aluminum and $18 \times 10^6$ lbs/in$^2$ for copper, for the thickness of the layers 14 and 16 given above, the strengths of these layers 14 and 16 are substantially equal. For example, the product of the thickness of layer 16 and its modulus of elasticity, 0.040 ($18 \times 10^6$), substantially equals the product of the thickness of the layer 14 and its modulus of elasticity 0.073 ($10 \times 10^6$). A satisfactory limitation of the expansion of the surface site 20 is accomplished if the ratio of the strengths of the layers 14 and 16 is at least within ± 60 percent of each other, and preferably within ± 20 percent of each other. Ideally, of course, the ratios of their strengths should be substantially equal to each other.

The operation of the multilayer heat sink 10, in conjunction with the operation of the heat-producing device 22, will now be explained. Let it be assumed that the heat-producing device 22 is in a circuit (not shown) that produces heat which must be dissipated for the device 22 to operate efficiently. Heat collected by the substrate 48 is conducted through the layers 16 and 14 of the heat sink 10 and onto the said sheet 12. Let it also be assumed that the layer 14 is of aluminum and the layer 16 is of copper so that the coefficient of linear thermal expansion of the layer 14 is greater than that of the layer 16. Let it further be assumed that the ratio of the strengths of the layers 14 and 16 is less than ± 60 percent. Under these conditions, the layers 14 and 16 expand and tend to bend in the direction indicated by the dashed line 52. The effect of this bending on the surface site 20 would be to cause a lesser expansion, due to compressive forces, at the surface site 20 than would ordinarily occur on an unconstricted piece of copper. Because of the dimpled portion 24 in the layer 16, an additional bending movement tends to occur as the heat sink 10 is heated and the layers 14 and 16 expand. This latter bending movement forces the dimpled portion 24 to bend in the direction indicated by the dashed line 54, a bending direction opposite to that indicated by the dashed line 52. By a careful choice of the dimensions *h*, *w*, and *t*, as explained supra, the tendencies of the surface site 20 to bend according to the opposite curvatures, represented by the dashed lines 52 and 54, can be made approximately equal and opposite, thereby maintaining the surface site 20 substantially unchanged. Hence, any tendency of the device 22 to break away from the surface site 20, that would result from a change in a dimension of the surface site 20, is reduced.

Figure 3:
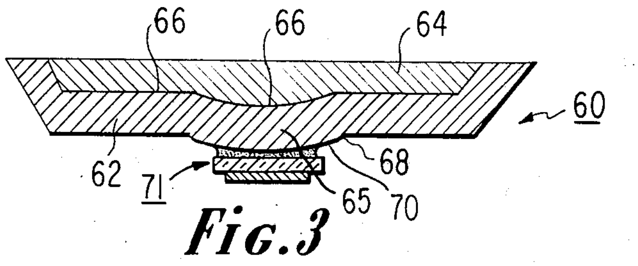
FIG. 3 is a cross-sectional view of another embodiment of the novel multilayer heat sink.

Referring now to FIG. 3 of the drawing, there is shown a multilayer heat sink 60, another embodiment 60 of the present invention. The heat sink 60 comprises a first layer 62 of a metal substantially similar to that comprising the layer 16 of FIG. 1, and a second layer 64 substantially similar to that comprising the layer 14 of FIG. 1. The metal of the layer 62 should have a smaller coefficient of thermal expansion than that of the layer 64.

The first layer 62 has a dish-like shape formed with an outwardly extending dimpled portion 65. The dish-like shape may, for example, be round, elliptical, square, or rectangular. The second layer 64 may be a metal that is first molten and then solidified in the concave portion of the dish-like structure of the first layer 62 to form an integral structure therewith, and having a common interface 66 therewith. A dented portion 65 provides a pedestal 68 with an outer surface site 70, which preferably is planar or slightly convex, upon which a heat-producing device 71 (such as the device 22 in FIG. 1) can be mounted. The operation of the heat sink 60 is the same as that described for the multilayer heat sink 10 in FIG. 1.

Thus, there has been described improved multilayer heat sinks wherein a pedestal is provided for mounting a heat-producing device on a surface site thereon. Since the pedestal of the novel heat sinks may comprise a metal of good thermal conduction, good heat dissipation is provided. Also, because the pedestal is in compression, when heated, the thermal expansion of the site upon which a heat-producing device is mounted is not as great as it would ordinarily be in a conventional heat sink, thereby preventing the cracking and/or separation of the heat-producing device from the heat sink.

I claim:

1. In an assembly of the type comprising a heat-producing device mounted on a heat sink, the improvement comprising said heat sink comprising a multilayered structure of different metals which, when heated, tend to expand differently and to produce compressive forces resulting in a lesser expansion on a portion of one surface of said heat sink with respect to other surface portions of said heat sink, and said device being mounted on said portion, whereby to minimize stress between said device and said heat sink due to differences in their linear coefficients of expansion.

2. In an assembly of the type described in claim 1, said multilayered structure comprises two layers of dissimilar metals, fixed to each other, having a common interface and different coefficients of linear expansion, and said device is mounted on the layer having the lower coefficient of linear expansion of said two layers.

3. In an assembly of the type described in claim 2, a first layer of said two layers has said lower coefficient of linear expansion, a raised dimpled portion in said first layer extends from a dent in said first layer at said interface, and said device is mounted on a surface of said raised dimpled portion.

4. An assembly comprising a heat-producing device and a laminated heat sink including first and second metal members bonded together, said first metal member being attached to said device by a bond and having a greater thermal expansion than said device, whereby said bond is tended to be stessed when said assembly is heated, said second metal member cooperating with said first metal member to produce a bimetal bending action when said heat sink is heated, which bending compressively stresses the surface of said first metal member to which said device is bonded, whereby the bending compression partially counteracts the thermal expansion of said first metal member to minimize the stress in said bond.

5. An assembly as described in claim 4, wherein said first and second metal members have a common interface, said first metal member has a raised portion extending from said interface, and said device is bonded to the surface of said raised portion.

6. In an electronic assembly of the type comprising a heat-producing device mounted on a heat sink, the improvement comprising said heat sink comprising a first layer of a first metal that tends to bend in an arc in a direction around said device when heated by said device, a second layer of a second metal, fixed to said first layer and having a portion that tends to bend in an arc in a direction opposite to that of said first layer when heated by said device, whereby to oppose the bending of said first layer, and said device being mounted on said second layer intermediate the ends thereof.

7. In an electronic assembly of the type described in claim 6, wherein:

said first and said second layers have a common interface, said second layer has a raised portion, and said device is mounted on a surface of said raised portion.

8. A multilayer heat sink for receiving a heat-producing device thereon, said heat sink comprising:

a metallic structure comprising a first layer of a first metal, and a second layer of a second metal fixed to said first layer and having a common interface therewith, said second metal having a greater coefficient of thermal expansion than that of said first metal, the product of the thickness of said first layer and its modulus of elasticity being within ± 60% of the product of the thickness of said second layer and its modulus of elasticity, and a surface site intermediate ends of said first layer for receiving said heat-producing device thereon.

9. A multilayer heat sink for receiving a heat-producing device thereon, as described in claim 8, wherein:

the product of the thickness of said first layer and its modulus of elasticity is within ± 20 percent of the product of the thickness of said second layer and its modulus of elasticity.

10. A multilayer heat sink for receiving a heat-producing device thereon, as described in claim 8, wherein:

said first metal has a raised portion intermediate opposite ends of said first layer, and said surface site is a surface of said raised portion.

11. A multilayer heat sink for receiving a heat-producing device thereon, said heat sink comprising:

a metallic structure comprising a first layer of a first metal, and a second layer of a second metal fixed to said first layer and having a common interface therewith, said second metal having a greater coefficient of thermal expansion than that of said first metal, said first layer having a dimpled portion extending outwardly from said interface, a second portion of said second layer, extending to said dimpled portion of said first layer, at said interface, and said dimpled portion of said first layer having a surface site for receiving said heat-producing device.

12. A multilayered heat sink for receiving a heat-producing device thereon, as described in claim 11, wherein:

the product of the thickness of said first layer and its modulus of elasticity is within ± 20 percent of the product of the thickness of said second layer and its modulus of elasticity.

13. A multilayer heat sink for receiving a heat-producing device thereon, as described in claim 11, wherein:

the product of the thickness of said first layer and its modulus of elasticity is within ± 60 percent of the product of the thickness of said second layer and its modulus of elasticity.

14. A multilayer heat sink for receiving a heat-producing device thereon, as described in claim 11, wherein:

said second portion of said second layer, at said interface, extends to said dimpled portion of said first layer a distance of between 15 percent and 35 percent of the total thickness of said metal structure adjacent to said dimpled and said second portions thereof.

15. A multilayered heat sink for receiving a heat-producing device thereon, as described in claim 11, wherein:

said second portion of said second layer, at said interface, extends to said dimpled portion of said first layer a distance of between 1 percent and 70 percent of the total thickness of said metal structure adjacent said dimpled and said second portions thereof.

16. A multilayer heat sink for receiving a heat-producing device thereon, as described in claim 11, wherein:

said dimpled portion has a base with an average diameter of between 50 percent and 150 percent of the average diameter of the mounting surface of said heat-producing device.

17. A multilayer heat sink for receiving a heat-producing device thereon, as described in claim 11, wherein:

said dimpled portion has a base with an average diameter of between 20 percent and 300 percent of the average diameter of the mounting surface of said heat-producing device.

18. A multilayer heat sink for receiving a heat-producing device thereon, as described in claim 11, wherein:

said surface site of said dimpled portion for receiving said heat-producing device is a convex surface.

* * * * *